United States Patent
Nam

(10) Patent No.: US 10,749,133 B2
(45) Date of Patent: Aug. 18, 2020

(54) ANODE STRUCTURE FOR AN ORGANIC LIGHT EMITTING DIODE DISPLAY DEVICE

(71) Applicant: DB HITEK CO., LTD., Seoul (KR)

(72) Inventor: Sang Woo Nam, Cheongju-si (KR)

(73) Assignee: DB HITEK CO., LTD., Seoul (KR)

(*) Notice: Subject to any disclaimer, the term of this patent is extended or adjusted under 35 U.S.C. 154(b) by 66 days.

(21) Appl. No.: 16/216,241

(22) Filed: Dec. 11, 2018

(65) Prior Publication Data

US 2019/0181372 A1    Jun. 13, 2019

(30) Foreign Application Priority Data

Dec. 11, 2017 (KR) .................. 10-2017-0169245

(51) Int. Cl.
*H01L 51/52* (2006.01)
*H01L 27/32* (2006.01)
*H01L 51/50* (2006.01)

(52) U.S. Cl.
CPC ...... *H01L 51/5218* (2013.01); *H01L 27/3244* (2013.01); *H01L 27/3246* (2013.01); *H01L 51/5012* (2013.01)

(58) Field of Classification Search
CPC ............. H01L 51/5218; H01L 27/3246; H01L 51/5012; H01L 27/3244
See application file for complete search history.

(56) References Cited

U.S. PATENT DOCUMENTS

| | | | | |
|---|---|---|---|---|
| 2007/0194710 A1* | 8/2007 | Song | ................... | H01L 27/3276 313/512 |
| 2016/0027813 A1* | 1/2016 | Xu | ...................... | H01L 27/3265 257/71 |
| 2016/0307988 A1* | 10/2016 | Kim | .................... | H01L 27/1237 |

FOREIGN PATENT DOCUMENTS

KR     10-0791011     12/2007

OTHER PUBLICATIONS

Application and Filing Receipt for U.S. Appl. No. 16/136,468, filed Sep. 20, 2018, Inventor(s): Hyo Jung et al.
Application and Filing Receipt for U.S. Appl. No. 16/216,234, filed Dec. 11, 2018, Inventor(s): Woo Nam et al.

* cited by examiner

*Primary Examiner* — Stewart A Fraser
(74) *Attorney, Agent, or Firm* — Patterson Thuente Pedersen, P.A.

(57) ABSTRACT

An anode structure of an organic light emitting diode display device, includes an insulating interlayer disposed on a silicon substrate, a first metal layer pattern disposed on the insulating interlayer comprising a first metal to be configured to upwardly reflect light, a second metal layer pattern formed on the first metal layer pattern comprising a second metal having a work function of 4.0 eV or more, and a diffusion barrier layer pattern interposed between the first metal layer pattern and the second metal layer pattern for preventing elements of the first metal or the second metal from diffusing between the first metal layer and the second metal layer.

11 Claims, 3 Drawing Sheets

ANODE STRUCTURE FOR AN ORGANIC LIGHT EMITTING DIODE DISPLAY DEVICE

CROSS-REFERENCE TO RELATED APPLICATION

This application claims priority to Korean Patent Application No. 10-2017-0169245, filed on Dec. 11, 2017 and all the benefits accruing therefrom under 35 U.S.C. § 119, the contents of which are incorporated by reference in their entirety.

TECHNICAL FIELD

The present disclosure relates to organic light emitting diode display devices, and in particular to an anode structure, an array cell unit, including the same, and a light emitting diode display device including the same.

BACKGROUND

Flat panel display devices such as plasma display panels (PDP), liquid crystal display (LCD) devices, and organic light emitting diode (OLED) display devices have been widely studied and utilized.

OLED display devices are spontaneous light emitting devices. OLED display devices may therefore be downsized and lightened relative to LCD devices because an OLED display device may not require a backlight unit which has been normally implemented into LCD devices.

Further, OLED display devices have a better viewing angle and contrast ratio than LCD devices using liquid crystals. Furthermore, OLED display devices may have advantages in terms of power consumption, and may be driven by a relatively low DC voltage and with a quick response speed. OLED display devices may be resistant to external impact and may have a wide driving temperature range. In particular, since the manufacturing process is simple, there is an advantage that the production costs may be saved more than through the use of conventional LCD devices.

Organic light emitting diode display devices may include a signal control unit for controlling a signal for each pixel, an organic light emitting unit for generating light for each pixel using an organic material according to the signal, and an anode cell array unit being interposed between the signal control unit and the organic light emitting unit to define each of cells by isolating each pixel. The anode cell array unit may include an anode structure.

Anode cell array units may include an insulating interlayer formed on the signal control unit, and an anode structure configured to receive the control signal from the signal control unit.

It is often desirable for the anode structure to effectively reflect light emitted from the organic light emitting unit and to have excellent electrical characteristics in relation to anode current, hole-electron recombination, and the like.

SUMMARY

The example embodiments of the present disclosure provide an anode structure having a high reflective efficiency and improved electric characteristics. The example embodiments of the present disclosure provide an anode cell array unit for an organic light emitting diode display device including the anode structure. The example embodiments of the present disclosure provide an organic light emitting diode display device including the anode cell array unit.

According to an example embodiment, an anode structure of an organic light emitting diode display device comprising an insulating interlayer disposed on a silicon substrate, a first metal layer pattern disposed on the insulating interlayer, the first metal layer pattern comprising a first metal to be configured to upwardly reflect light emitted from an organic light emitting unit disposed on the anode structure, a second metal layer pattern formed on the first metal layer pattern, the second metal layer pattern comprising a second metal having a work function of 4.0 eV or more, and a diffusion barrier layer pattern interposed between the first metal layer pattern and the second metal layer pattern for preventing elements of the first metal or the second metal from diffusing between the first metal layer and the second metal layer.

In an example embodiment, the diffusion barrier layer pattern may comprise metal nitride. In an example embodiment, the diffusion barrier layer pattern may comprise titanium nitride.

In an example embodiment, the first metal may comprise aluminum-copper alloy, the second metal may comprise cobalt, and the diffusion barrier layer pattern may comprise titanium nitride.

In an example embodiment, the diffusion barrier layer pattern may have a thickness of about 25 to 50 Å.

According to an example embodiment, an anode cell array unit for an organic light emitting diode display device having an organic light emitting diode unit being disposed on an upper portion of a substrate structure unit including an active element for each of a plurality of pixels, the anode cell array unit includes an anode structure disposed on the substrate structure unit and configured to be electrically connected to the active element for each of the plurality of pixels, the anode structure including an insulating interlayer being isolated from the active element, a first metal layer pattern disposed on the insulating interlayer, comprising a first metal configured to upwardly reflect light emitted from the organic light emitting unit, a second metal layer pattern formed on the first metal layer pattern, the second metal layer pattern comprising a second metal having a work function of 4.0 eV or more, and a diffusion barrier layer pattern interposed between the first metal layer pattern and the second metal layer pattern for preventing elements of the first metal or the second metal from diffusing between the first metal layer and the second metal layer, and an anode cell isolator for each pixel of the plurality of pixels penetrating through the anode structure and protruding upward from the anode structure, each anode cell isolator being configured to define a plurality of cells by isolating the pixel from others of the plurality of pixels.

In an example embodiment, the first metal may comprise aluminum-copper alloy, the second metal may comprise cobalt, and the diffusion barrier layer pattern may comprise titanium nitride.

In an example embodiment, the diffusion barrier layer pattern may have a thickness of about 25 to 50 Å.

In an example embodiment, a leakage current suppressing layer pattern may be further disposed on the anode structure surrounding a sidewall of each anode cell isolator to suppress a leakage current that may occur in an interface region adjacent to an interface between each anode cell isolator and the anode structure.

In an example embodiment, the leakage current suppressing layer pattern may make contact with an upper sidewall of each anode cell isolator and a top surface of the anode structure.

According to an example embodiment, an organic light emitting diode display device comprises a substrate structure unit including a substrate and an active element for each pixel of a plurality of pixels disposed on the substrate. The organic light emitting diode display device further comprises an anode cell array unit disposed on the substrate structure unit and electrically connected to each active element, the anode cell array unit including an anode structure having an insulating interlayer being isolated from the active elements, a first metal layer pattern disposed on the insulating interlayer, and the first metal layer pattern comprising a first metal configured to upwardly reflect light emitted from an organic light emitting unity, a second metal layer pattern formed on the first metal layer pattern, the second metal layer pattern comprising a second metal having a work function of 4.0 eV or more, and a diffusion barrier layer pattern interposed between the first metal layer pattern and the second metal layer pattern for preventing elements of the first metal or the second metal from diffusing between the first metal layer and the second metal layer, and an anode cell isolator for each pixel of the plurality of pixels penetrating through the anode structure and protruding upward from the anode structure, each anode cell isolator defining a cell by isolating the pixel from others of the plurality of pixels. The organic light emitting unit may be disposed on the anode cell array unit and emit light in response to a signal of a signal control unit.

According to embodiments of the present disclosure, the anode structure for the organic light emitting diode display device includes a diffusion barrier layer pattern interposed between the first metal layer pattern and the second metal layer pattern, so the diffusion of the first and the second metal may be prevented between the first and the second metal layer pattern. Thus, the work function loss of the second metal layer pattern, which may occur due to the diffusion of the metal elements between the first and the second metal layer patterns, may be suppressed. Furthermore, the diffusion barrier layer pattern may maintain a surface uniformity of the second metal layer pattern.

Meanwhile, the anode cell array unit for the organic light emitting diode display device including the anode structure may further include an electric field concentration suppressing layer pattern between the anode cell array isolator and the anode structure to suppress the electric field concentration around the interface, therefore the generation of a leakage current that may be suppressed may be suppressed.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Example embodiments can be understood in more detail from the following description taken in conjunction with the accompanying drawings, in which.

Figure 1:
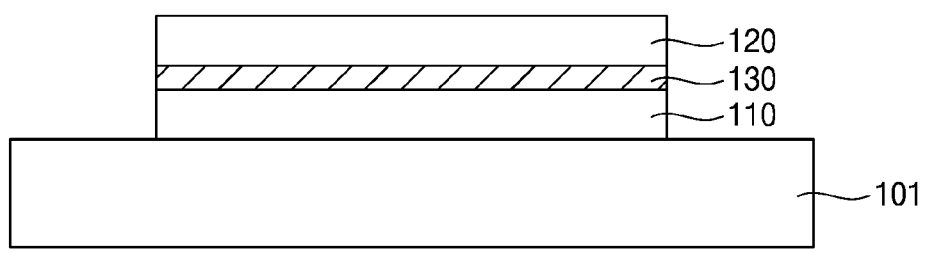
FIG. 1 is a cross sectional view illustrating an anode structure for an organic light emitting diode (OLED) display device in accordance with an example embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, specific embodiments will be described in more detail with reference to the accompanying drawings. The present disclosure may, however, be embodied in different forms and should not be construed as limited to the embodiments set forth herein.

As an explicit definition used in this application, when a layer, a layer, a region or a plate is referred to as being 'on' another one, it can be directly on the other one, or one or more intervening layers, layers, regions or plates may also be present. Unlike this, it will also be understood that when a layer, a layer, a region or a plate is referred to as being 'directly on' another one, it is directly on the other one, and one or more intervening layers, layers, regions or plates do not exist. Also, though terms like a first, a second, and a third are used to describe various components, compositions, regions and layers in various embodiments of the present disclosure are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present disclosure. Unless otherwise defined herein, all the terms used herein, which include technical or scientific terms, may have the same meaning that is generally understood by those skilled in the art.

The depicted embodiments are described with reference to schematic diagrams of some embodiments of the present disclosure. Accordingly, changes in the shapes of the diagrams, for example, changes in manufacturing techniques and/or allowable errors, are sufficiently expected. Accordingly, embodiments of the present disclosure are not described as being limited to specific shapes of areas described with diagrams and include deviations in the shapes and also the areas described with drawings are entirely schematic and their shapes do not represent accurate shapes and also do not limit the scope of the present disclosure.

FIG. 1 is a cross sectional view illustrating an anode structure for an organic light emitting diode (OLED) display device in accordance with an example embodiment of the present disclosure.

Referring to FIG. 1, an anode structure 100 according to an example embodiment of the present disclosure includes an insulating interlayer 101, a first metal layer pattern 110, a second metal layer pattern 120, and a diffusion barrier layer pattern 130. Alternatively, although not shown, the anode structure 100 may be formed on another insulating interlayer (not shown).

The insulating interlayer 101 may electrically insulate the anode structure 100 from a unit formed under the anode structure 100. The insulating interlayer 101 may comprise, for example, silicon dioxide or silicon oxynitride.

The first metal layer pattern 110 is formed on the insulating interlayer 101. The first metal layer pattern 110 may reflect upwardly light emitted from an organic light emitting unit 30 (see FIG. 2) disposed over the first metal layer pattern 110. Thus, a luminance of the organic light emitting unit 30 may be increased.

Also, the first metal layer pattern 110 may include a first metal having a relatively good reflectivity. For example, the first metal layer pattern 110 may comprise aluminum, copper, or an alloy thereof. The first metal layer pattern 110 may have a thickness of about 1,000 to about 5,000 Å.

The second metal layer pattern 120 is formed over the first metal layer pattern 110. The second metal layer pattern 120 may include a second metal having a work function of about 4.0 eV or greater. For example, the second metal layer pattern 120 may comprise cobalt (Co). Thus, the anode structure 100 having the second metal layer pattern 120 may require relatively high photon energy for photoelectron emission. As a result, the anode structure 100 having the second metal layer pattern 120 may effectively provide emission control functionality to an organic light emitting unit. Therefore, the second metal layer pattern 120 made of the second metal having a work function of 4.0 eV or more may have excellent anode current, hole-electron pair recombination characteristics.

The diffusion barrier layer pattern 130 is interposed between the first metal layer pattern 110 and the second metal layer pattern 120. The diffusion barrier layer pattern 130 may prevent elements from diffusing between the first metal layer pattern 110 and the second metal layer pattern 120. Accordingly, the diffusion barrier layer pattern 130 may suppress a reduction in work function of the second metal layer pattern 120 due to diffusion of the elements between the first metal layer pattern 110 and the second metal layer pattern 120. Furthermore, the diffusion barrier layer pattern 130 may maintain a surface uniformity of the second metal layer pattern 120.

The diffusion barrier layer pattern 130 may be formed of a metal nitride. For example, the diffusion barrier layer pattern 130 may comprise titanium nitride.

The diffusion barrier layer pattern 130 may have a thickness of about 25 to about 50 Å. When the diffusion barrier layer pattern has a thickness of less than 25 Å, the elements of the first metal or the second metal may be diffused across the diffusion barrier layer pattern 130. Thus, the effectiveness of the diffusion barrier layer pattern 130 for suppressing diffusion of the element between the first metal layer pattern 110 and the second metal layer pattern 120 may be deteriorated. On the other hand, when the diffusion barrier layer pattern 130 has a thickness over 50 Å, the diffusion barrier layer pattern 130 may excessively absorb light emitted from the organic light emitting unit disposed over the diffusion barrier layer pattern 130. As a result, light reflection efficiency of the anode structure 100 may deteriorate.

Figure 2:
FIG. 2 is a cross sectional view illustrating an anode cell array unit for an organic light emitting diode (OLED) display device in accordance with an example embodiment of the present disclosure.
Figure 3:
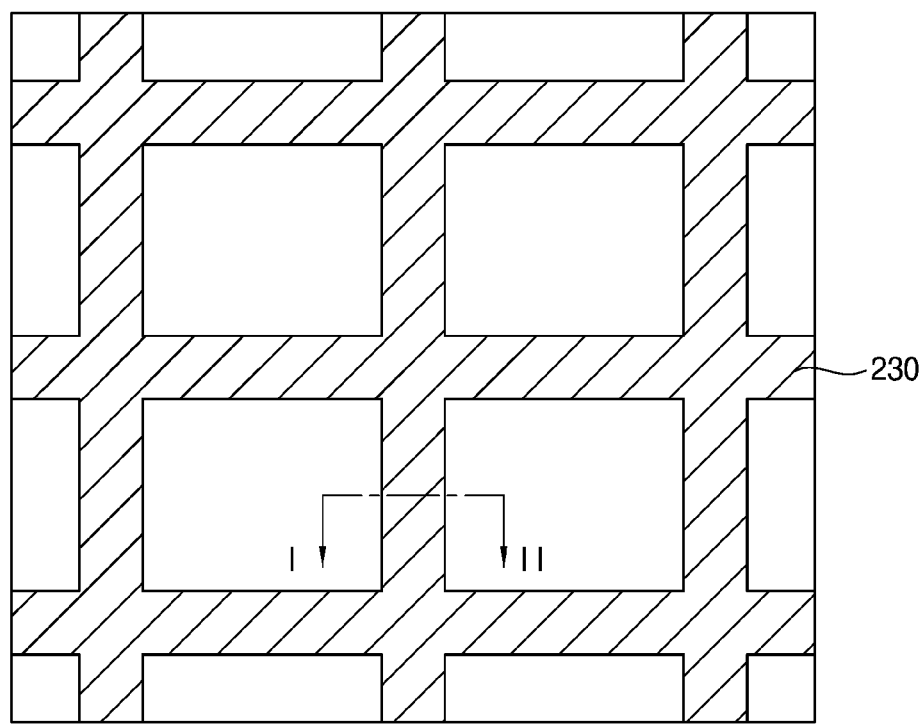
FIG. 3 is a plan view illustrating the anode cell array unit in FIG. 2.
Figure 4:
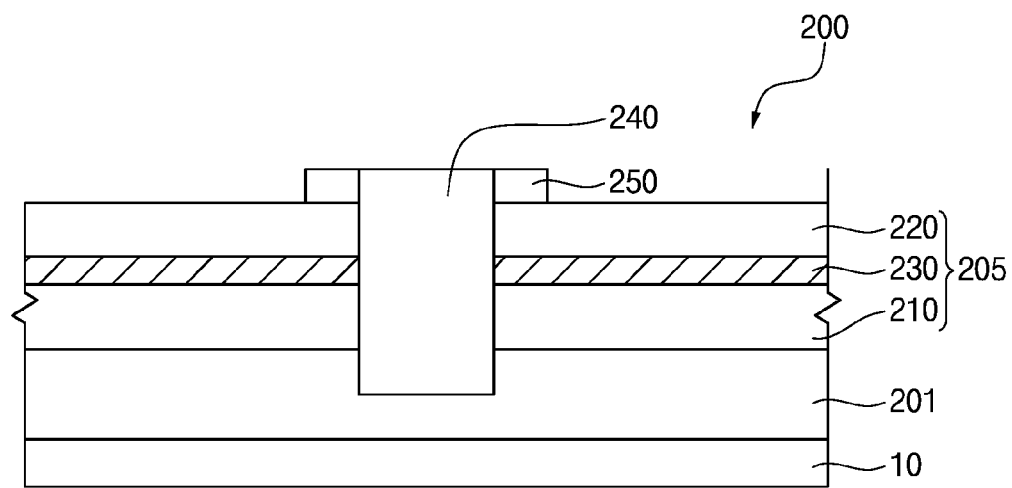
FIG. 4 is a cross sectional view taken along a line I-II in FIG. 3.

FIG. 2 is a cross sectional view illustrating an anode cell array unit for an organic light emitting diode (OLED) display device in accordance with an example embodiment of the present disclosure. FIG. 3 is a plan view illustrating the anode cell array unit in FIG. 2. FIG. 4 is a cross sectional view taken along a line I-II in FIG. 3.

Referring to FIGS. 2 to 4, an anode cell array unit 200 according to an embodiment of the present disclosure includes an anode structure 205 and an anode cell isolator 240. The anode cell array unit 200 may be disposed on a substrate structure unit 10 including an active element for each pixel, and an organic light emitting unit 30 may be disposed over the substrate structure unit 10. That is, the anode cell array unit 200 may be interposed between the substrate structure unit 10 and the organic light emitting unit 30. In addition, the anode cell array unit 200 may control the driving of each of light emitting diodes by applying a control signal generated from the substrate structure unit 10 to light emitting diodes included in the organic light emitting unit 30. The active element (not shown) may include a CMOS transistor formed on a substrate. That is, an active element including a gate insulating layer, an active region, a source region, and a drain region may be formed on the substrate.

Alternatively, the active element may include an erasable programmable read only memory (EPROM) capable of erasing data by irradiating ultraviolet rays, and an electrically erasable programmable read only memory (EEPROM) capable of erasing data using electricity instead of ultraviolet light.

The insulating interlayer 201 is disposed on the substrate structure unit 10. The insulating interlayer 201 electrically insulates the substrate structure unit 10 from the anode structure of anode cell array unit 200. The insulating interlayer 201 may comprise, for example, silicon dioxide or silicon oxynitride. The insulating interlayer 201 may have a uniform thickness.

The anode structure 205 is formed on the insulating interlayer 201. The anode structure 205 is electrically connected to the active element included in the substrate structure unit 10.

Accordingly, the anode structure 205 may drive a light emitting diode (not shown) included in the organic light emitting unit 30 using the electric signal transmitted through the active element. In addition, the anode structure 205 may control driving of the light emitting diode along together with the cathode structure (not shown) included in the organic light emitting unit 30. The anode structure 205 may have a trench vertically penetrating therethrough.

The anode structure 205 includes a first metal layer pattern 210, a second metal layer pattern 220, and a diffusion barrier layer pattern 230. A detailed description of the anode structure 205 has been illustrated above with reference to FIG. 1, so a detailed description thereof will be omitted in order to avoid redundancy.

The anode cell isolator 240 is provided to penetrate through the anode structure 205. That is, the anode cell isolator 240 may vertically penetrate through the anode structure 205 to define a plurality of cells corresponding to pixels of the anode structure 205 as a whole. For example, as depicted in FIG. 3, the anode cell isolator 240 may have a matrix shape in a plan view. Accordingly, a plurality of anode structures 205 adjacent to the anode cell isolator 240 may be partitioned into a plurality of cells. In other embodiments, the anode cell isolator 240 may have a stripe, or other shape.

The anode cell isolator 240 protrudes upwardly from the anode structure 205. That is, the anode cell isolator 240 may protrude from an upper surface of the anode structure 205 to include a protrusion portion.

The anode cell isolator 240 is formed, for example, through a device isolation process such as a shallow trench isolation (STI) process. That is, the anode cell isolator 240 may be formed by filling a trench formed through the anode structure 205 with an insulating material.

In an embodiment of the present disclosure, the anode cell array unit 200 may further include a leakage current suppressing layer pattern 250.

The leakage current suppressing layer pattern 250 is disposed on the anode structure 205. The leakage current suppressing layer pattern 250 is provided to surround a sidewall of the anode cell isolator 240. That is, the leakage current suppressing layer pattern 250 may be formed to surround the sidewall of the protruded portion of the anode cell isolator 240. For example, when the anode cell isolator 240 has a stripe shape, the leakage current suppressing layer pattern 250 may extend along both sidewalls of the anode cell isolator 240. The leakage current suppressing layer pattern 250 may include silicon dioxide or silicon oxynitride.

The leakage current suppressing layer pattern 250 may suppress the electric field concentration in an interface region adjacent to the interface between the anode cell isolator 240 and the anode structure 205. Thus, a leakage current that may be generated due to the electric field concentration may be suppressed in the interface region.

The leakage current suppressing layer pattern 250 may be provided to contact the upper sidewall of the anode cell isolator 240 and the upper surface of the anode structure 205. In this case, therefore, the leakage current suppressing layer pattern 250 may entirely cover the interface region adjacent to the interface between the anode cell isolator 240 and the anode structure 205. As a result, it is possible to suppress the leakage current generated in the interface region more effectively owing to the leakage current suppressing layer pattern 250.

In an embodiment of the present disclosure, the anode cell isolator 240 and the leakage current suppressing layer pattern 250 may have a T-shape as a whole when viewed in a vertical section, such as depicted in FIG. 4. Accordingly, when the anode structure 205 includes the first metal layer pattern 210 for reflecting light, the reflection efficiency of the first metal layer pattern 210 may be improved.

Figure 5:
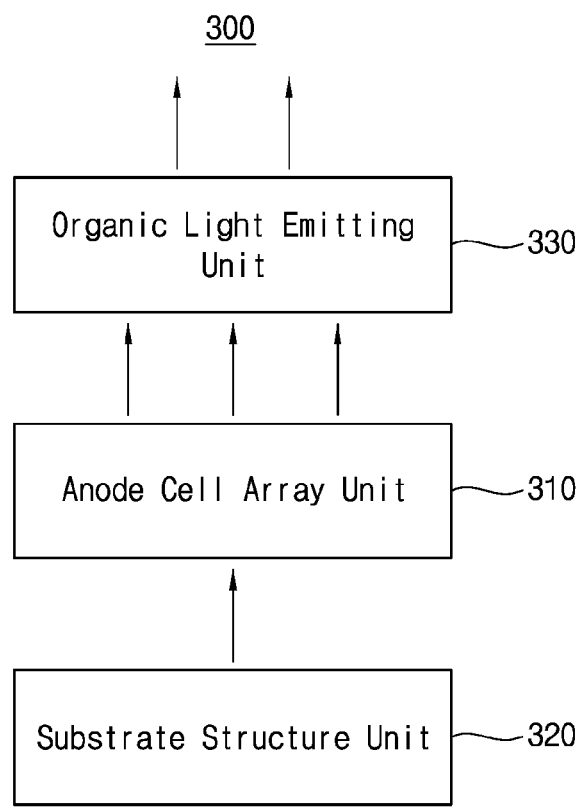
FIG. 5 is a block diagram illustrating an organic light emitting diode (OLED) display device in accordance with an example embodiment of the present disclosure.
Figure 6:
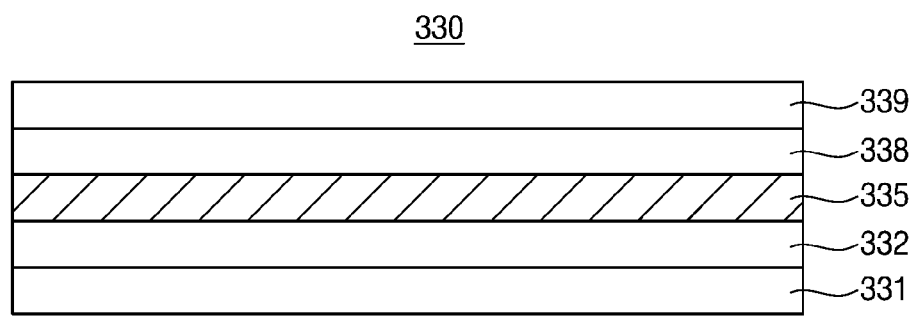
FIG. 6 is a cross sectional view illustrating an organic light emitting unit in FIG. 5.

FIG. 5 is a block diagram illustrating an organic light emitting diode (OLED) display device 300 accordance with an example embodiment of the present disclosure. FIG. 6 is a cross sectional view illustrating the organic light emitting unit of FIG. 5.

As depicted in FIGS. 5 and 6, an organic light emitting diode display device 300 according to an example embodiment of the present disclosure includes a substrate structure unit 320, an anode cell array unit 310, and an organic light emitting unit 330.

Substrate structure unit 320 may be substantially similar to substrate structure unit 10, and anode cell array unit 310 may be substantially similar to anode cell array unit 200, as described with with reference to FIGS. 1 to 4.

The organic light emitting unit 330 is provided on the anode cell array unit 310. The organic light emitting unit 330 is driven using the anode voltage generated from the anode cell array unit 310.

Referring to FIG. 6, the organic light emitting unit 330 includes an insulating interlayer 331, a hole-transport layer 332, a light emitting layer 335, an electron-transfer layer 338, and a cathode electrode 339.

The holes injected into the anode cell array unit 310 move to the light emitting layer 335 through the hole-transfer layer 332. Electrons injected from the cathode electrode 339 move to the light emitting layer 335 through the electron-transfer layer 338. Thus, the holes and electrons transferred to the light emitting layer 335 are recombined to emit light.

Although the anode cell array unit and the organic light emitting diode display have been described with reference to the specific embodiments, they are not limited thereto. Therefore, it will be readily understood by those skilled in the art that various modifications and changes can be made thereto without departing from the spirit and scope of the appended claims.

It should be understood that the individual steps used in the methods of the present teachings may be performed in any order and/or simultaneously, as long as the teaching remains operable. Furthermore, it should be understood that the apparatus and methods of the present teachings can include any number, or all, of the described embodiments, as long as the teaching remains operable.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that embodiments may comprise fewer features than illustrated in any individual embodiment described above. The embodiments described herein are not meant to be an exhaustive presentation of the ways in which the various features may be combined. Accordingly, the embodiments are not mutually exclusive combinations of features; rather, embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Moreover, reference in the specification to "one embodiment," "an embodiment," or "some embodiments" means that a particular feature, structure, or characteristic, described in connection with the embodiment, is included in at least one embodiment of the teaching. The appearances of the phrase "in one embodiment" in various places in the specification are not necessarily all referring to the same embodiment.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of Section 112, sixth paragraph of 35 U.S.C. are not to be invoked unless the specific terms "means for" or "step for" are recited in a claim.

What is claimed is:

1. An anode structure of an organic light emitting diode display device, the anode structure comprising:
   an insulating interlayer disposed on a silicon substrate;
   a first metal layer pattern disposed on the insulating interlayer, the first metal layer pattern comprising a first metal configured to upwardly reflect light emitted from an organic light emitting unit disposed on the anode structure;
   a second metal layer pattern formed on the first metal layer pattern, the second metal layer pattern comprising a second metal having a work function of 4.0 eV or more; and
   a diffusion barrier layer pattern interposed between the first metal layer pattern and the second metal layer pattern for preventing elements of the first metal or the second metal from diffusing between the first metal layer and the second metal layer.

2. The anode structure of claim 1, wherein the diffusion barrier layer pattern comprises metal nitride.

3. The anode structure of claim 2, wherein the diffusion barrier layer pattern comprises titanium nitride.

4. The anode structure of claim 1, wherein the first metal comprises an aluminum-copper alloy, the second metal comprises cobalt, and the diffusion barrier layer pattern comprises titanium nitride.

5. The anode structure of claim 1, wherein the diffusion barrier layer pattern has a thickness of about 25 to 50 Å.

6. An anode cell array unit for an organic light emitting diode display device having an organic light emitting diode unit being disposed on an upper portion of a substrate structure unit including an active element for each of a plurality of pixels, the anode cell array unit comprising:
   an anode structure disposed on the substrate structure unit and configured to be electrically connected to the active element for each of the plurality of pixels, the anode structure including an insulating interlayer being isolated from the active element, a first metal layer pattern disposed on the insulating interlayer, and the first metal layer pattern including a first metal configured to upwardly reflect light emitted from the organic light emitting unit, a second metal layer pattern formed on the first metal layer pattern comprising a second metal having a work function of 4.0 eV or more, and a diffusion barrier layer pattern interposed between the first metal layer pattern and the second metal layer pattern for preventing elements of the first metal or the second metal from diffusing between the first metal layer and the second metal layer; and
   an anode cell isolator for each pixel of the plurality of pixels penetrating through the anode structure and protruding upward from the anode structure, each anode cell isolator being configured to define a one of plurality of cells by isolating the pixel from others of the plurality of pixels.

7. The anode cell array unit of claim 6, wherein the first metal comprises aluminum-copper alloy, the second metal comprises cobalt, and the diffusion barrier layer pattern comprises titanium nitride.

8. The anode cell array unit of claim 6, wherein the diffusion barrier layer pattern has a thickness of about 25 to 50 Å.

9. The anode cell array unit of claim 6, further comprising: a leakage current suppressing layer pattern disposed on the anode structure and surrounding a sidewall of each anode cell isolator to suppress a leakage current that in an interface region adjacent to an interface between each anode cell isolator and the anode structure.

10. The anode cell array unit of claim 9, wherein the leakage current suppressing layer pattern makes contact with an upper sidewall of each anode cell isolator and a top surface of the anode structure.

11. An organic light emitting diode display device comprising:
   a substrate structure unit including a substrate and an active element for each pixel of a plurality of pixels disposed on the substrate;
   an anode cell array unit disposed on the substrate structure unit and electrically connected to the active elements, the anode cell array unit comprising—
      an anode structure having an insulating interlayer being isolated from the active elements,
      a first metal layer pattern disposed on the insulating interlayer comprising a first metal to be configured to upwardly reflect light emitted from an organic light emitting unit,
      a second metal layer pattern formed on the first metal layer pattern comprising a second metal having a work function of 4.0 eV or more,
      a diffusion barrier layer pattern interposed between the first metal layer pattern and the second metal layer pattern for preventing elements of the first metal or the second metal from diffusing between the first metal layer and the second metal layer,
      and an anode cell isolator for each of the plurality of pixels penetrating through the anode structure and protruding upward from the anode structure, and each anode cell isolator defining a cell by isolating the pixel from others of the plurality of pixels;
   wherein the organic light emitting unit is disposed on the anode cell array unit and is configured to light in response to a signal of a signal control unit.

* * * * *